(12) United States Patent
Lue et al.

(10) Patent No.: US 7,881,123 B2
(45) Date of Patent: Feb. 1, 2011

(54) MULTI-OPERATION MODE NONVOLATILE MEMORY

(75) Inventors: Hang Ting Lue, Hsinchu (TW); Kuang Yeu Hsieh, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 2 days.

(21) Appl. No.: 11/234,678

(22) Filed: Sep. 23, 2005

(65) Prior Publication Data

US 2007/0081393 A1   Apr. 12, 2007

(51) Int. Cl.
*G11C 16/04* (2006.01)
(52) U.S. Cl. ............................. 365/185.28; 365/185.29
(58) Field of Classification Search ............. 365/185.28
See application file for complete search history.

(56) References Cited

U.S. PATENT DOCUMENTS

| | | | |
|---|---|---|---|
| 4,959,812 A | 9/1990 | Momodomi et al. | |
| 5,270,969 A | 12/1993 | Iwahashi | |
| 5,293,331 A | 3/1994 | Hart et al. | |
| 5,424,569 A | 6/1995 | Prall | |
| 5,448,517 A | 9/1995 | Iwahashi | |
| 5,515,324 A | 5/1996 | Tanaka | |
| 5,644,533 A | 7/1997 | Lancaster et al. | |
| 5,699,298 A | 12/1997 | Shiau et al. | |
| 5,768,192 A | 6/1998 | Eitan | |
| RE35,838 E | 7/1998 | Momodomi et al. | |
| 5,815,441 A | 9/1998 | Kobatake | |
| 5,937,424 A | 8/1999 | Leak et al. | |
| 6,011,725 A | 1/2000 | Eitan | |
| 6,172,907 B1 | 1/2001 | Jenne | |
| 6,215,148 B1 | 4/2001 | Eitan | |
| 6,222,767 B1 * | 4/2001 | Kendall et al. ......... | 365/185.12 |
| 6,229,732 B1 | 5/2001 | Lin et al. | |
| 6,229,737 B1 | 5/2001 | Walukas | |
| 6,370,062 B2 | 4/2002 | Choi | |
| 6,436,768 B1 | 8/2002 | Yang et al. | |
| 6,458,642 B1 | 10/2002 | Yeh et al. | |
| 6,487,114 B2 | 11/2002 | Jong et al. | |
| 6,490,196 B1 | 12/2002 | Hsu et al. | |

(Continued)

FOREIGN PATENT DOCUMENTS

EP    1063652    12/2000

(Continued)

OTHER PUBLICATIONS

Bloom, Ilan, et al., "2-Bit Cell NV Memory Minimizes Chip Area with Less Masks," Nikkei Electronics Asia, Jan. 2002, 12 pages.

(Continued)

*Primary Examiner*—Huan Hoang
*Assistant Examiner*—Jason Lappas
(74) *Attorney, Agent, or Firm*—Kenta Suzue; Haynes Beffel & Wolfeld LLP

(57) ABSTRACT

Disclosed are various embodiments that program a memory array with different carrier movement processes. In one application, memory cells are programmed with a particular carrier movement process depending on the pattern of data usage, such as code flash and data flash. In another application, memory cells are programmed with a particular carrier movement process depending on particular threshold voltage state to be programmed, in a multi-level cell scheme.

26 Claims, 9 Drawing Sheets

U.S. PATENT DOCUMENTS

| | | | |
|---|---|---|---|
| 6,512,700 B1* | 1/2003 | McPartland et al. | 365/185.28 |
| 6,566,699 B2 | 5/2003 | Eitan | |
| 6,614,694 B1 | 9/2003 | Yeh et al. | |
| 6,643,181 B2 | 11/2003 | Sofer et al. | |
| 6,671,209 B2 | 12/2003 | Lin et al. | |
| 6,690,601 B2 | 2/2004 | Yeh et al. | |
| 6,771,541 B1* | 8/2004 | Park | 365/185.22 |
| 6,778,442 B1* | 8/2004 | Hamilton et al. | 365/185.28 |
| 6,826,084 B1 | 11/2004 | Wong | |
| 6,829,175 B2 | 12/2004 | Lu et al. | |
| 6,917,544 B2 | 7/2005 | Maayan et al. | |
| 7,158,411 B2 | 1/2007 | Yeh et al. | |
| 2002/0172075 A1 | 11/2002 | Park et al. | |
| 2002/0179958 A1 | 12/2002 | Kim | |
| 2003/0137873 A1 | 7/2003 | Kawamura | |
| 2003/0185055 A1 | 10/2003 | Yeh et al. | |
| 2004/0027856 A1 | 2/2004 | Lee et al. | |
| 2004/0042295 A1 | 3/2004 | Fujiwara et al. | |
| 2004/0071030 A1 | 4/2004 | Goda et al. | |
| 2004/0136240 A1* | 7/2004 | Zheng et al. | 365/185.29 |
| 2005/0226054 A1* | 10/2005 | Yeh et al. | 365/185.28 |
| 2005/0237809 A1 | 10/2005 | Shih et al. | |
| 2006/0062054 A1* | 3/2006 | Hamilton et al. | 365/189.07 |

FOREIGN PATENT DOCUMENTS

| | | |
|---|---|---|
| JP | 09162313 A | 6/1997 |
| JP | 11233653 A | 8/1999 |
| JP | 2004-039866 | 2/2004 |

OTHER PUBLICATIONS

Chung, Steve S., et al., "A Novel Leakage Current Separation Technique in a Direct Tunneling Regime Gate Oxide SONOS Memory Cell," IEEE 2003, 4 pages.

De Blauwe, Jan, "Nanocrystal Nonvolatile Memory Devices," IEEE Transactions on Nanotechnology, vol. 1, No. 1, Mar. 2002, 72-77.

Hirose, M., "Challenges for Future Semiconductor Development," International Microprocess and Nanotechnology Conference, Nov. 6, 2002, 47 pages.

Lee, Changhyun, et al., "A Novel Structure of SiO2/SiN/High k Dielectrics, Al203 for SONOS Type Flash Memory," Extended Abstracts of the 2002 International Conference on Solid State Devices and Materials, Nagoya, Japan, 2002, 162-163.

Lee, Chang Hyun, et al., "A Novel SONOS Structure of SiO2/SiN/Al203 with TaN Metal Gate for Multi-Giga Bit Flash Memeries," IEEE 2003, 4 pages.

Lee, Jae-Duk, et al., "Effects of Floating-Gate Interference on NAND Flash Memory Cell Operation," IEEE Electron Device Letters, vol. 23, No. 5, May 2002, 264-266.

Prinz, E.J., et al., "An Embedded 90nm SONOS Flash EEPROM Utilizing Hot Electron Injection Programming and 2-Sided Hot Hole Injection Erase," NVM Workshop 2003, 2 pages.

Ruden, P. Paul, et al., "Modeling of band-to-band tunneling transitions during drift in Monte Carlo transport simulations," J. Appl. Phys., vol. 88, No. 3, Aug. 1, 2000, 1488-1493.

Shih, Yen Hao, et al., U.S. Appl. No. 10/876,374, filed on Jun. 24, 2004, entitled "Operation Scheme with High Work Function Gate and Charge Balancing for Charge Trapping Non-Volatile Memory," 74 pages.

Shin, Yoocheol, et al., "High Reliable SONOS-type NAND Flash Memory Cell with Al203 for Top Oxide," Non-Volatile Semiconductor Memory Workshop, 2003, 2 pages.

Yeh, C.C., et al., "PHINES: A Novel Low Power Program /Erase, Small Pitch, 2-Bit per Cell Flash Memory," IEEE IEDM, 2002, 931-934.

Swift, C.T., et al., "An Embedded 90nm Sonos Nonvolatile Memory . . . " IEDM 2002, Dec. 8-11, 2002, 927-930. cited by other.

She, Min, et al., "Silicon-Nitride as a Tunnel Dielectric . . . "IEEE Electron Device Letters 24(), May 2003, 3 pages. cited by other.

Kim, Byungcheul, et al., "A Scaled Sonos Single—Transistor. . . " J. Korean Phys. Soc. 41(6), Dec. 2002, 945-948. cited by other.

* cited by examiner

FIRST CARRIER MOVEMENT
PROCESS - PROGRAM
(LEFT BIT)

FIRST CARRIER MOVEMENT
PROCESS - PROGRAM
(RIGHT BIT)

SECOND CARRIER MOVEMENT
PROCESS - PROGRAM
(LEFT BIT)

SECOND CARRIER MOVEMENT
PROCESS - PROGRAM
(RIGHT BIT)

DATA ERASE
(BOTH BITS)

MULTI-OPERATION MODE NONVOLATILE MEMORY

BACKGROUND OF THE INVENTION

1. Field of the Invention

The present invention relates to electrically programmable and erasable non-volatile memory and integrated circuits including such memory, and more particularly to architectures for such devices supporting multiple algorithms for programming, erasing, and reading such memory.

2. Description of Related Art

Electrically programmable and erasable non-volatile memory technologies, including flash memory, are being adapted to many applications. Technologies based upon floating gates like standard EEPROM, or localized charge trapping structures like oxide-nitride-oxide memory cells known in various architectures as SONOS cells and NROM, are typically programmable and erasable many times. Flash memory technologies can be differentiated according to their use for storing data or code. Thus, market segments for so-called data flash and so-called code flash have developed.

Data flash has several characteristics: (1) high density storage; (2) fast page program speed (for example: 16 k bit per page); (3) fast page read speed. Data flash often is used for mass storage applications, where the data stored may include image files produced using digital cameras, files and directory structures in flash cards, audio files like MP3 files, and files of digital samples from analog signals, and other storage applications in which a majority of the program, erase and read transactions involve patterns of data usage involving relatively large data sets. Three representative memory architectures that can serve the data flash market, include: NAND (Toshiba/Samsung), AG-AND (Renesas) and PHINES (Macronix; see Yeh, et al., PHINES: a Novel Low Power Program/Erase, Small Pitch, 2-Bit per Cell Flash Memory Cell, 2002 IEDM, p. 931-934; and U.S. Pat. No. 6,690,601). Among the just listed alternatives, the floating gate based NAND architecture might be considered the current mainstream architecture for data flash.

Code flash has several characteristics, including (1) fast byte (8 bits) program speed; and (2) fast random memory access time for single bit for sensing. Code flash is often used for storage of data like computer instructions and parameters for devices like personal computers and mobile phones, in which a majority of the program, erase and read transactions involve patterns of data usage involving relatively small data sets, like updates to instructions and subroutine segments within computer programs and setting and changing values in parameter sets. Three representative memory architectures that can serve the code flash market, include: NOR (Intel, AMD; see U.S. Pat. No. 6,370,062), DINOR, split-gate and NROM (See, U.S. Pat. No. 5,768,192). Among the just listed alternatives, the floating gate based NOR architecture might be considered the current mainstream architecture for code flash. Although it has been proposed to use NROM memory to store both code and data, the operation algorithm used for NROM is considered more suitable to use as code flash.

In general, data flash and code flash are differentiated by operation algorithms for programming, erasing and reading the data, and by the memory cell structures which are adapted to the operation algorithms. Thus, integration of conventional flash memory technology for both code and data flash purposes has not been practical. Accordingly, much existing technology relies upon two chips, one for code flash and one for data flash, to serve these functions. More recent technology relies upon one chip, with multiple arrays having different memory cell structures, one for code flash and one for data flash, to serve these functions. The cost of systems in terms of space on the board, the number of chips, and difficulty in design is high as a result.

Accordingly, it is desirable to provide systems and methods for providing integrated flash memory on the same memory array of a single chip for both code and data storage.

Another trend in flash memory technologies is the increasing density of data storage. Floating gates like standard EEPROM are generally highly conductive structures and thus each has a single region for storing data. Localized charge trapping structures like oxide-nitride-oxide memory cells, known in various architectures as SONOS cells and NROM, store bits in different parts of the charge trapping structure, and thus each charge trapping structure has multiple regions for storing data. Multi-level cell algorithms associate more than two threshold voltage states to each region for storing data. For example, a multi-level cell algorithm with four threshold voltage state stores two bits in region for storing data a multi-level cell algorithm with eight threshold voltage state stores three bits in region for storing data.

Accordingly, it is desirable to provide systems and methods for providing flash memory with a multi-level cell algorithm supporting higher densities of data storage.

SUMMARY OF THE INVENTION

Various embodiments store data in charge storage, non-volatile memory cells of a memory array. The nonvolatile memory cells store data in response to electrical signals applied to cause various carrier movement processes to program data.

The different carrier movement processes are used for different patterns of data usage. For example, in one application, one carrier movement process can be optimal for code flash and another carrier movement process can be optimal for data flash. Another application implements multi-level cell memory, with a range of threshold voltages. Different carrier movement processes are applied over different parts of the range of threshold voltages.

The different non-volatile memory cells in the memory array that are programmed with different carrier movement processes have a same cell structure. When switching between different carrier movement processes in the same nonvolatile memory cells of the memory array, electrical signals are applied to cause a reset process to the nonvolatile memory cells. Alternatively, a particular memory cell once programmed with a particular carrier movement process can be consistently programmed with the same carrier movement process.

Each non-volatile memory cell in the memory array has a first channel terminal, a channel, and a second channel terminal in the substrate, a first dielectric layer, a charge trapping structure and a second dielectric layer overlying the channel, and a gate terminal. The charge trapping structure has silicon nitride, $Al_2O_3$, HfOx, ZrOx, or other metal oxide. In other embodiments the charge storage structure is a floating gate.

Various examples of carrier movement processes are programming by hole injection, band-to-band tunneling induced hot-hole injection (BTBTHH), electron injection, channel hot electron injection (CHE), and channel initiated secondary electron injection (CHISEL). Different carrier movement processes that are implemented in the same array are, for example, programming by hole injection and electron injection, or programming by band-to-band tunneling induced hot-hole injection) BTBTHH) and channel initiated secondary electron (CHISEL) injection.

Some embodiments have the controller circuitry on the semiconductor substrate. Some embodiments have an SRAM array and a user programmable processor on the semiconductor substrate coupled with the memory array.

One embodiment is an integrated circuit device with the memory array on a semiconductor substrate and controller circuitry with logic to apply electrical signals to cause the various carrier movement processes. Another embodiment is a method for manufacturing an integrated circuit device, by providing a semiconductor substrate, forming the memory array on the substrate, and providing the controller circuitry coupled to the memory array. A method embodiment includes applying electrical signals to the memory array to cause different carrier movement process to program data in the memory array.

Various embodiments raise, lower, and reset a threshold voltage of one or more cells via different carrier movement processes. For example, the threshold voltage is raised via channel hot electron (CHE) injection or channel initiated secondary electron (CHISEL) injection, the threshold voltage is lowered via band to band tunneling hot hole (BTBTHH) injection, and the threshold voltage is reset via a channel erase operation.

DETAILED DESCRIPTION

Figure 1:
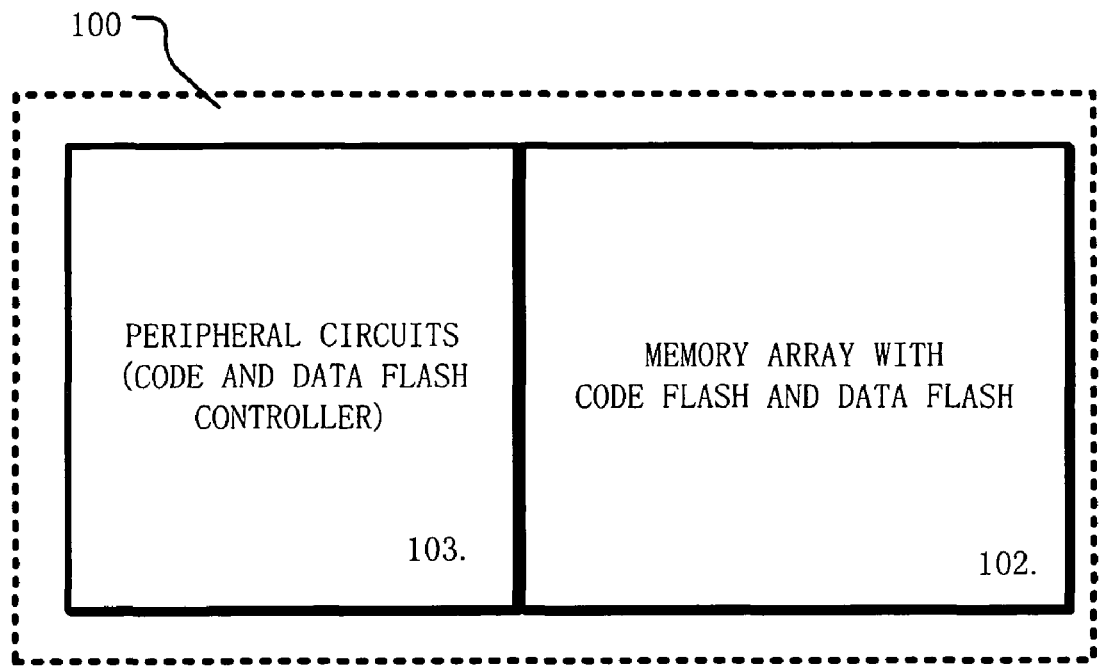
FIG. 1 is a block diagram of an integrated circuit having a memory array that stores data according to different patterns of data usage.

FIG. 1 illustrates an embodiment of the present technology, an integrated circuit 100 that comprises a memory array 102 adapted for code flash applications and for data flash applications. Thus, data for both code flash applications and for data flash applications can be stored in a single memory array, instead of different arrays or on different integrated circuits. The integrated circuit 100 may even have multiple such arrays that are each capable of storing data for both code flash applications and for data flash applications. Peripheral circuits 103 on the integrated circuit 100 include a code and data flash controller which execute first and second operation algorithms which are adapted for the patterns of data usage corresponding with code flash and data flash applications. The memory cells in the array 102 have substantially the same structure, regardless of whether the memory cells store data according to the first or second operation algorithms. The first and second operation algorithms differ to efficiently support different patterns of data usage within a single integrated circuit device.

Figure 2:
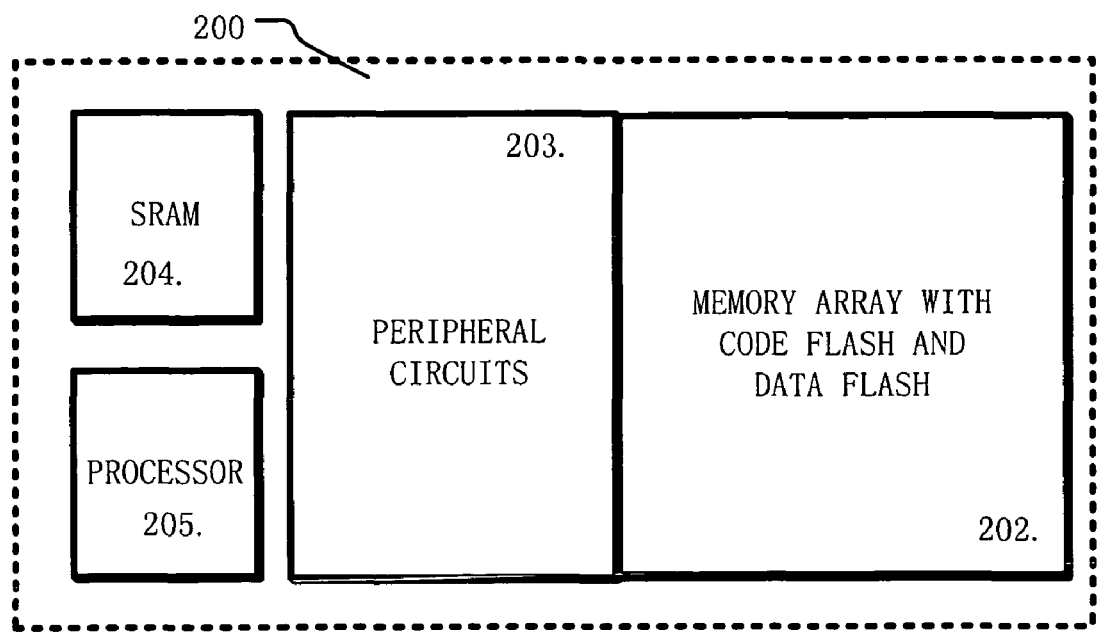
FIG. 2 is a block diagram of a system-on-a-chip integrated circuit having a memory array that stores data according to different patterns of data usage.

The integrated circuit shown in FIG. 1 may include other components not shown in figure. For example, FIG. 2 illustrates a "system on a chip" (SOC) integrated circuit 200, having a memory array 202 adapted for code flash applications and for data flash applications, and peripheral circuits 203 including a code and data flash controller as described with respect to FIG. 1. The integrated circuit 200 also includes SRAM memory 204 and a user programmable processor 205, like a general-purpose processor or a digital signal processor. Additional components (not shown) such as data and instruction buses, input/output communication circuitry, field programmable logic arrays and so on can be formed on the same chip. In other embodiments, the controller for the memory array 202 can be implemented using the processor 205, special-purpose logic, or a combination of the two.

Figure 3:
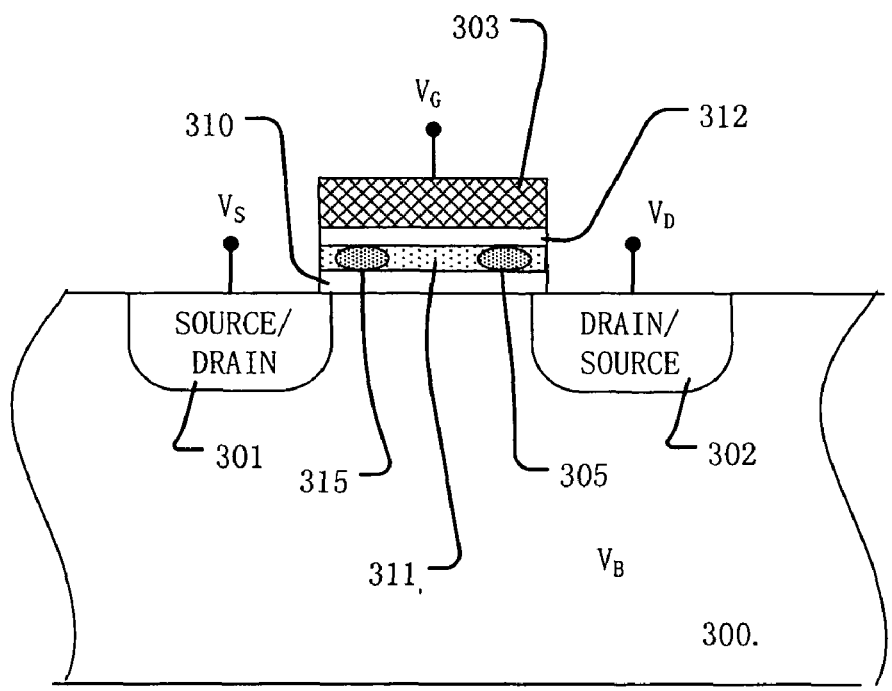
FIG. 3 is block diagram of a nonvolatile charge storage cell that programs data via different carrier movement processes.

FIG. 3 illustrates a memory cell structure suitable for a memory array according in various embodiments. The memory cell structure, formed in a semiconductor substrate 300 includes a first channel terminal 301 which acts as a source or drain, a second channel terminal 302 which act as a drain or source, and a channel region between the first channel terminal 301 and a second channel terminal 302. A charge storage structure comprises a first dielectric layer 310, a localized charge trapping structure 311, and a second dielectric layer 312 which overlies the channel region, and partially overlaps the first channel terminal 301 and the second channel terminal 302. A gate structure 303 overlies charge storage structure. The first dielectric layer 310 in some embodiments has a thickness greater than about 1 nm and less than about 20 nm, and more preferably about 6 or 7 nm. The second dielectric layer 312 has similar dimensions in some embodiments. In one exemplary embodiment, the first dielectric layer 310, the localized charge trapping structure 311, and the second dielectric layer 312 have respective thicknesses of 55 Å, 60 Å, and 90 Å.

The first channel terminal 301 is coupled to a voltage $V_S$ via a bit line, the second channel terminal 302 is coupled to a voltage $V_D$ via another bit line, and the gate structure 303 is coupled to a voltage $V_G$ via a word line in typical array embodiments. The substrate in which the channel region is formed is coupled to a voltage $V_B$. The operation algorithms for the memory array apply voltages or otherwise bias these terminals for program, erase, and read operations.

The charge storage structure comprises a layer of silicon nitride in the illustrated embodiment extending the width of the channel, which stores data by localized charge trapping. In other embodiments, charge trapping material other than silicon nitride may be used, such as $Al_2O_3$, $HfO_x$, $ZrO_x$, or other metal oxide can be used to form memory cells. Also, in other embodiments, the charge trapping material can be configured so that it does not extend the entire width of the channel, including for example a pocket of charge trapping material adjacent the first channel terminal 301, and a pocket of charge trapping material adjacent the second channel terminal 302.

As illustrated heuristically in FIG. 3, localized charge trapping results in storage of charge in one of region 305 and region 315 for a single charge storage region, and in both regions 305, 315 for storage at multiple charge storage regions per cell. Charge is moved into and out of the localized charge trapping regions in the memory cells of the memory array according to first and second operation algorithms adapted for different patterns of data usage or for multi-level cell operations. In other embodiments, the charge storage structure may comprise a floating gate.

Figure 4:
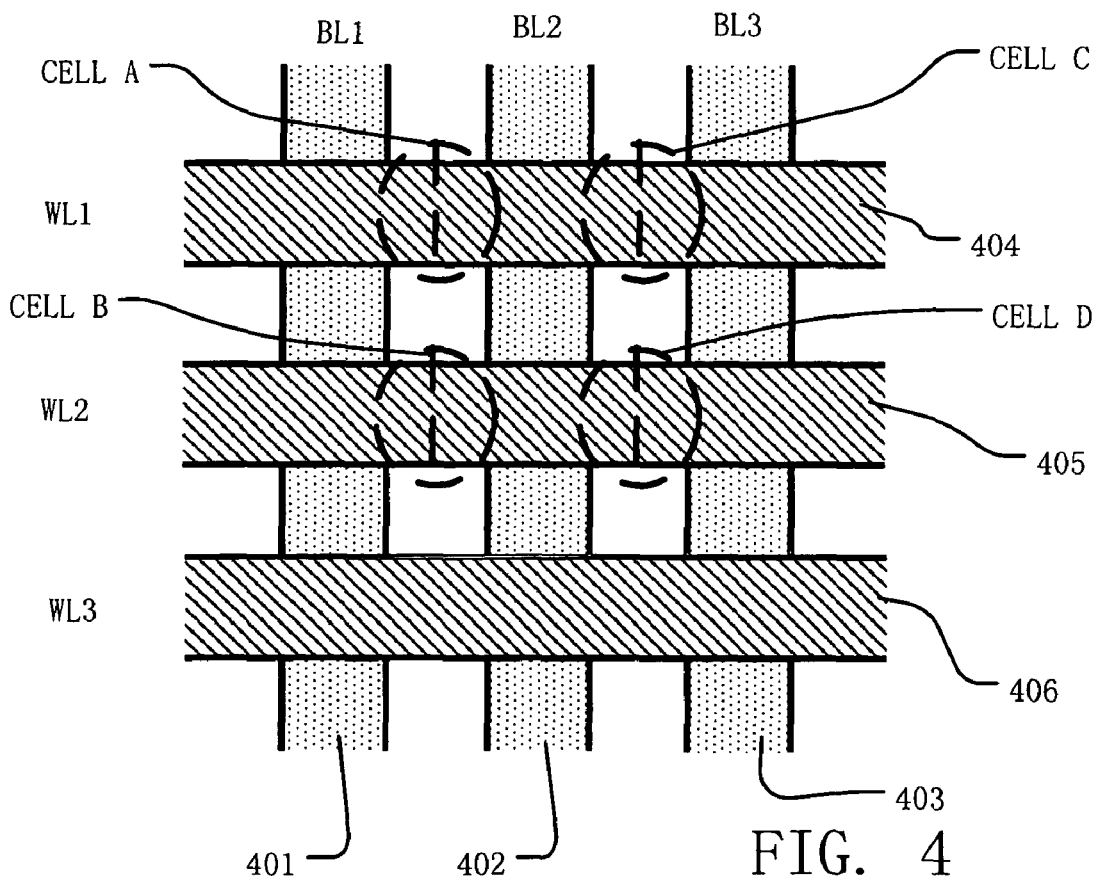
FIG. 4 is a layout diagram for an array of flash memory cells that program data via different carrier movement processes.

FIG. 4 is a layout view of an array of memory cells, such as those illustrated FIG. 3. In layout, the memory array shown in FIG. 4 includes bit lines BL1-BL3 which comprise buried diffusion lines 401, 402, and 403 arranged substantially parallel to one another in a first direction. Charge storage structures (not shown) are formed over the substrate between the buried diffusion bitlines. Word lines WL1-WL3 comprising conductive strips 404, 405, 406, overlie the charge storage structures, and are arranged substantially parallel to one another in a second direction which is orthogonal to the first direction. The memory cells in the array are formed using triple well technology, or other technology, to allow biasing of the channel regions in the substrate, as required for operation algorithms in some embodiments. Thus for example, the memory array is divided into sets of cells, (word lines, sectors, etc.) having numbers and arrangements adapted to the operation algorithm selected. Each set is formed in an isolated p-type well. The isolated p-type well is formed within a deep n-type well in a p-type substrate. In this triple well configuration, the isolated p-type wells can be biased as needed for operation of the memory array. In some embodiments, the array layout comprises isolation structures, such as STI (shallow trench isolation) isolation. In some embodiments, the array layout comprises contacts and metal wires for interconnections.

Memory cells identified as CELL A, CELL B, CELL C and CELL D in FIG. 4, result from sets of process steps by which the bit lines, charge storage structures and word lines are formed. The memory cells are illustrated schematically with a vertical dividing line indicating two bits per cell storage. In other embodiments, one bit per cell might be stored. In yet other embodiments more than two bits per cell can be stored in nonvolatile memory cells.

A set of process steps is used to form the memory array, which results in formation of a plurality of bit lines for the memory array, and formation of a plurality of word lines for the memory array. While forming the bit lines and the word lines according to a set of process steps, the sizes of the bit lines and the word lines may be varied if desired with simple changes in layout dimensions of a mask, without changes in the set of process steps applied to form the array. In integrated circuit embodiments with multiple arrays, array isolation structures and array partitions are also formed by a set of process steps, in the multiple arrays. The array isolation structure and partitions can be varied between the multiple arrays, without changes in the set of process steps in some embodiments.

In embodiments with multiple arrays, a set of process steps also results in simultaneous formation of the charge storage structures in both the multiple memory arrays, such that the memory cells in the arrays can be substantially the same. In other embodiments, the charge storage structures may vary slightly in process steps, allowing formation of memory cells with different thicknesses or compositions of dielectric layers for example.

Controllers for an integrated circuit execute operation algorithms that are adapted for first and second patterns of data usage or for multi-level cell operations. In one embodiment of the invention, the first and second patterns of data usage correspond with data flash applications and code flash applications respectively. First and second operation algorithms which cause different carrier movement processes to program data are illustrated with respect to FIGS. 5A and 5B and FIGS. 6A and 6B. According to this embodiment, the memory cell structure is substantially identical regardless of the particular carrier movement process to program data that is used in the memory cell. A representative first operation algorithm, adapted for patterns of data usage such as encountered in data flash applications corresponds with the operation algorithms typically applied for PHINES architectures, but in various embodiments is used for architectures adapted for multiple carrier movement processes.

Figure 5A:
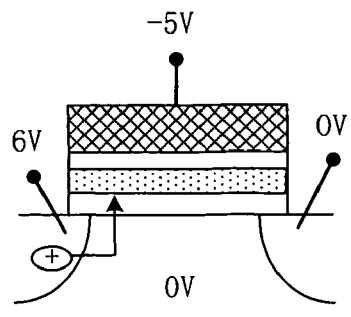
FIGS. 5A and 5B illustrate programming a memory cell via one carrier movement process.
Figure 5B:
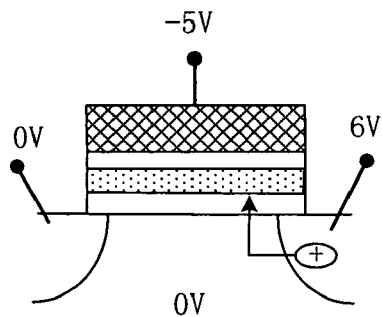

According to this first operation algorithm, programming is accomplished using band-to-band tunneling induced hot hole injection. Thus, as illustrated in FIG. 5A, a left bit is programmed by applying six volts to the source, zero volts to the drain, and minus five volts to the gate, while the substrate is grounded. This induces hot holes having sufficient energy to jump over the tunnel dielectric into the charge trapping structure on the left side of the memory cell. As illustrated in FIG. 5B, a right bit is programmed by applying six volts to the drain, zero volts to the source, and minus five volts to the gate, while the substrate is grounded. This induces hot holes having sufficient energy to jump over the tunnel dielectric into the charge trapping structure on the right side of the memory cell. The two bits are read according to this operation algorithm using reverse read operations. One example of reverse read is that when the left bit is read, a 1.6 V read voltage is applied to the right side. Similarly, when the right bit is read, a 1.6 V read voltage is applied to the left side. Other program and erase techniques can be used in operation algorithms applied to the PHINES type memory cell, as described for example in U.S. Pat. No. 6,690,601. Other memory cells and other operation algorithms might also be used.

A representative second operation algorithm, adapted for patterns of data usage such as encountered in code flash applications, corresponds with the operation algorithm typically applied for two-bit per cell NROM architectures, but in various embodiments is used for architectures adapted for multiple carrier movement processes.

Figure 6A:
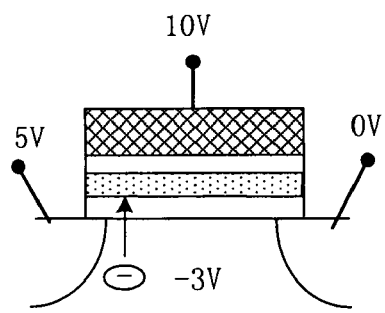
FIGS. 6A and 6B illustrate programming a memory cell via another carrier movement process.
Figure 6B:
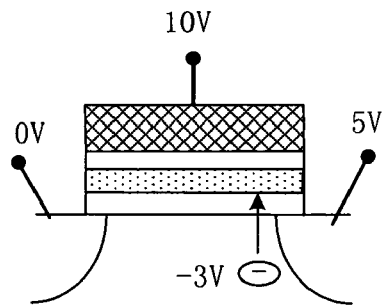

According to this second operation algorithm, programming is accomplished using channel initiated secondary electron (CHISEL) injection. Thus, as illustrated in FIG. 6A, a left bit is programmed by applying five volts to the source, zero volts to the drain, ten volts to the gate, and minus three volts to the body. This induces secondary hot electrons in the substrate having sufficient energy to jump over the tunnel dielectric into the charge trapping structure on the left side of the memory cell. As shown in FIG. 6B, a right bit is programmed by applying five volts to the drain, zero volts to the source, ten volts to the gate, and minus three volts to the body. This induces hot electrons in the substrate having sufficient energy to jump over the tunnel dielectric into the charge trapping structure on the right side of the memory cell. The two bits in the memory cells are read using reverse read operations. One example of reverse read is that when the left bit is read, a 1.6 V read voltage is applied to the right side. Similarly, when the right bit is read, a 1.6 V read voltage is applied to the left side. Other program and erase techniques can be used in operation algorithms applied to the NROM type memory cell. Other types of memory cells and operation algorithms might also be applied.

An erase operation is accomplished using the negative gate voltage, E-field induced electron tunneling (also known as Fowler-Nordheim tunneling) which causes tunneling current from the gate to the charge trapping structure. The erase operation erases both bits simultaneously. Regardless of the carrier movement process that programmed the memory cell, this erase process resets the threshold voltage(s) of the memory cell. Thus, prior to switching between causing different carrier movement processes in particular nonvolatile memory cells of the memory array of the memory array, the logic of the controller circuitry applies electrical signals to cause an erase operation in the particular nonvolatile memory cells.

Figure 7:
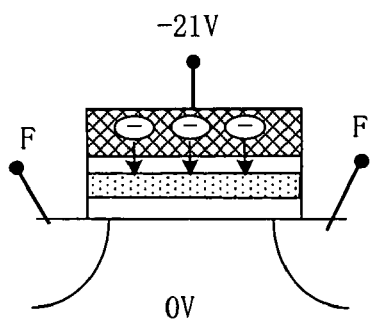
FIG. 7 illustrates an erase procedure.

FIG. 7 illustrates E-field assisted electron tunneling used for erase induced by relatively high negative bias on the gate, and relatively high positive bias on the substrate. Both bits in the memory cell are simultaneously erased in the illustrated example by grounding the substrate, and applying minus twenty-one volts to the gate, while both the source and the drain are floating. Other possible biases include, for example, applying ten volts to the substrate, and minus eleven volts to the gate, while both the source and the drain are floating; and grounding the gate, and applying twenty-one volts to the substrate, while both the source and the drain are floating.

Figure 8:
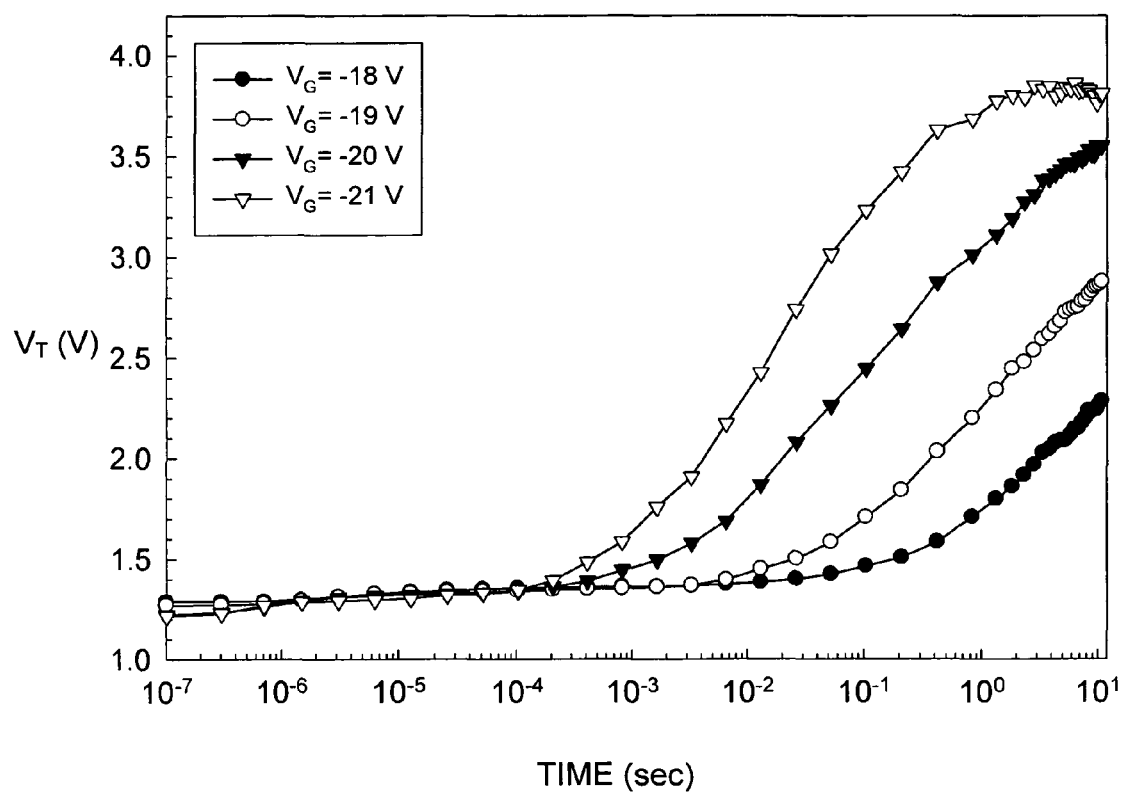
FIG. 8 is a graph showing the erase procedure of FIG. 7 being performed with different bias arrangements.

FIG. 8 is a graph showing the erase procedure of FIG. 7 with the substrate grounded, and both the source and the drain floating. The different curves on the graph correspond to different biases applied to the gate. As the magnitude of the negative bias on the gate is increased, the duration taken for the memory cell to reach an equilibrium decreases. Thus, as the gate bias is varied from minus eighteen volts to minus twenty-one volts, the threshold voltage rises more quickly from zero volts to the equilibrium threshold voltage. The beginning threshold voltage is zero volts for a fresh memory cell without any prior operations performed on the memory cell.

Figure 10:
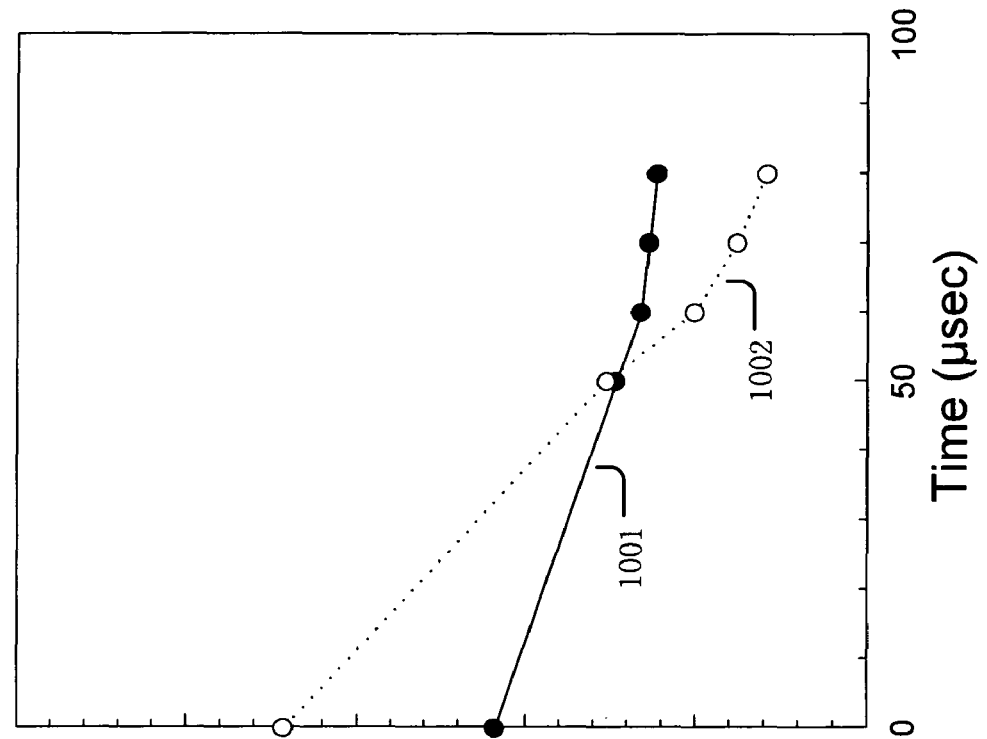
FIGS. 9 and 10 are graphs showing the programming of multiple charge storage regions of a memory cell with one carrier movement process.
Figure 9:
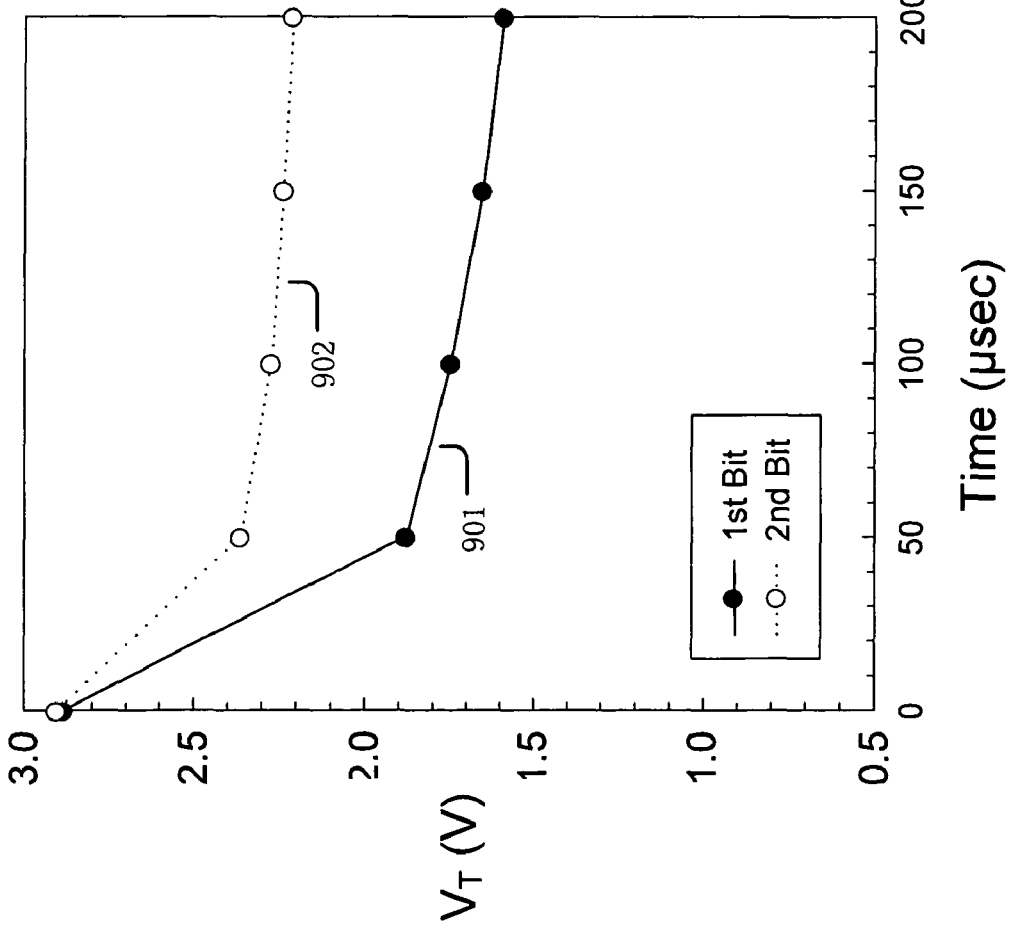

FIGS. 9 and 10 are graphs showing the programming procedure adding holes to the charge storage structure, according to the carrier movement processes shown in FIGS. 5A and 5B. FIG. 9 shows the programming of one part of a memory cell, and FIG. 10 shows the programming of another part of the memory cell. FIGS. 9 and 10 share a common voltage axis to more easily compare the processes of programming different parts of a memory cell. However, FIGS. 9 and 10 have different time axes to illustrate the different speeds of programming the first bit and programming the second bit. FIG. 9 has a time axis from 0 to 200 μsec, and FIG. 10 has a time axis from 0 to 100 μsec. FIGS. 9 and 10 refer to these different parts as bits, though each part may actually store multiple bits if a multi-level cell algorithm is used. FIG. 9 shows the curves for the first bit 901 and the second bit 902. FIG. 10 shows the curves for the first bit 1001 and the second bit 1002.

Both bits are initially in the erased state. In FIG. 9, the first bit is programmed. Due to the second bit effect of the reverse read process, the threshold voltage is decreased not only for the programmed bit, but also for the other bit which remains in the erased state. After programming the first bit, the threshold voltage associated with the first bit drops from three volts to about 1.6 volts, and the threshold voltage associated with the second bit drops from three volts to about 2.3 volts. In FIG. 10, the second bit is programmed. The threshold voltage associated with both the first and the second bits drop to about 1.2 volts. If programming of the second bit continues, both the threshold voltage associated with the first and the second bits continue to drop, though the threshold voltage associated with the second bit drops at a faster rate. As the different time scales of FIGS. 9 and 10 show, programming the second bit is a faster process than programming the first bit.

Figure 12:
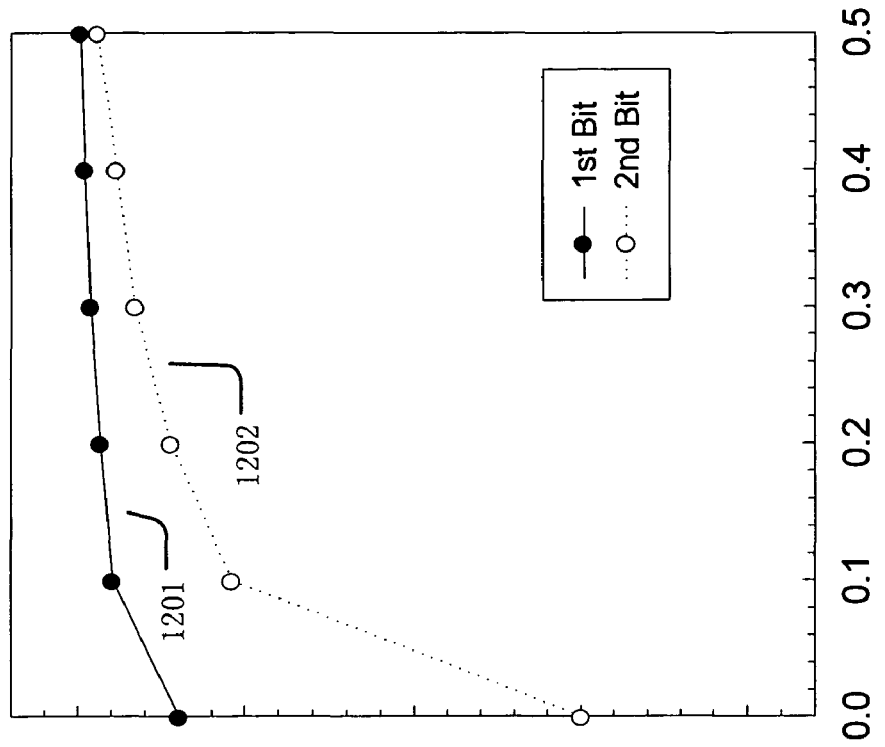
FIGS. 11 and 12 are graphs showing the programming of multiple charge storage regions of a memory cell with another carrier movement process.
Figure 11:
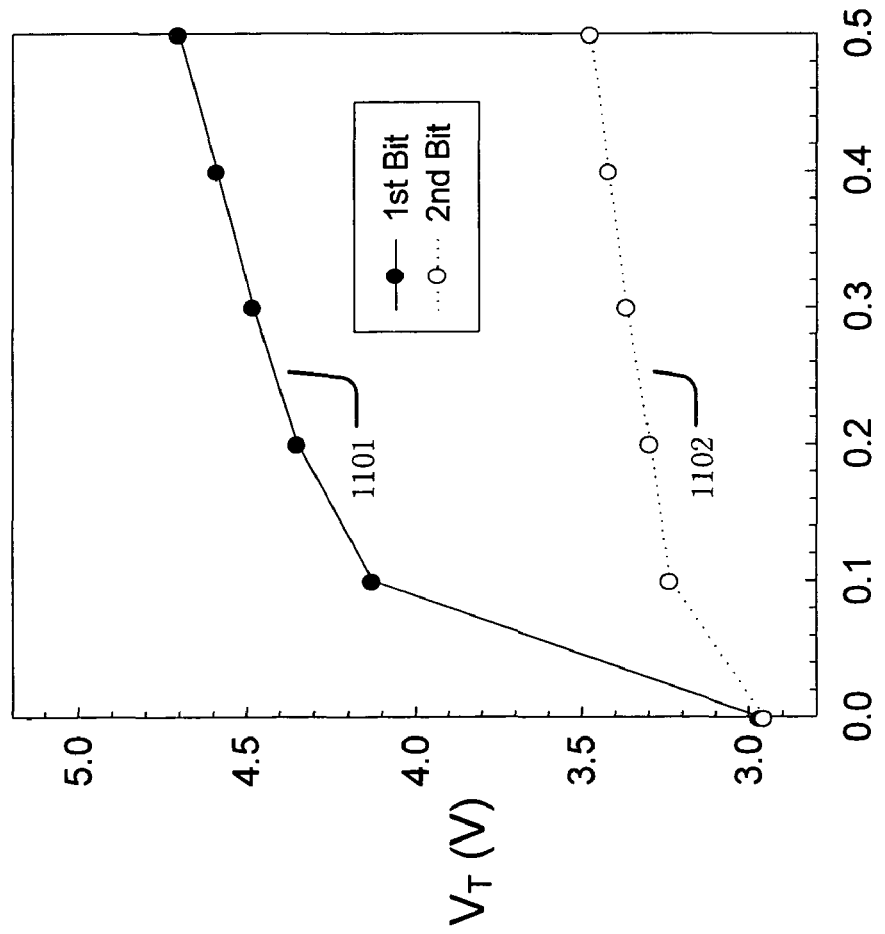

FIGS. 11 and 12 are graphs showing the programming procedure adding electrons to the charge storage structure, according to the carrier movement processes shown in FIGS. 6A and 6B. FIG. 11 shows the programming of one part of a memory cell, and FIG. 12 shows the programming of another part of the memory cell. FIGS. 11 and 12 also share a common voltage axis to more easily compare the processes of programming different parts of a memory cell. Both FIGS. 11 and 12 have a time axis from 0 to 0.5 μsec. FIGS. 11 and 12 refer to these different parts as bits, though each part may actually store multiple bits if a multi-level cell algorithm is used. FIG. 11 shows the curves for the first bit 1101 and the second bit 1102. FIG. 12 shows the curves for the first bit 1201 and the second bit 1202.

Both bits are initially in the erased state. In FIG. 11, the first bit is programmed. Due to the second bit effect of the reverse read process, the threshold voltage is increased not only for the programmed bit, but also for the other bit which remains in the erased state. After programming the first bit, the threshold voltage associated with the first bit rises from three volts to about 4.7 volts, and the threshold voltage associated with the second bit rises from three volts to about 3.5 volts. In FIG. 12, the second bit is programmed. The threshold voltage associated with both the first and the second bits rise to about 5.0 volts.

Figure 13:
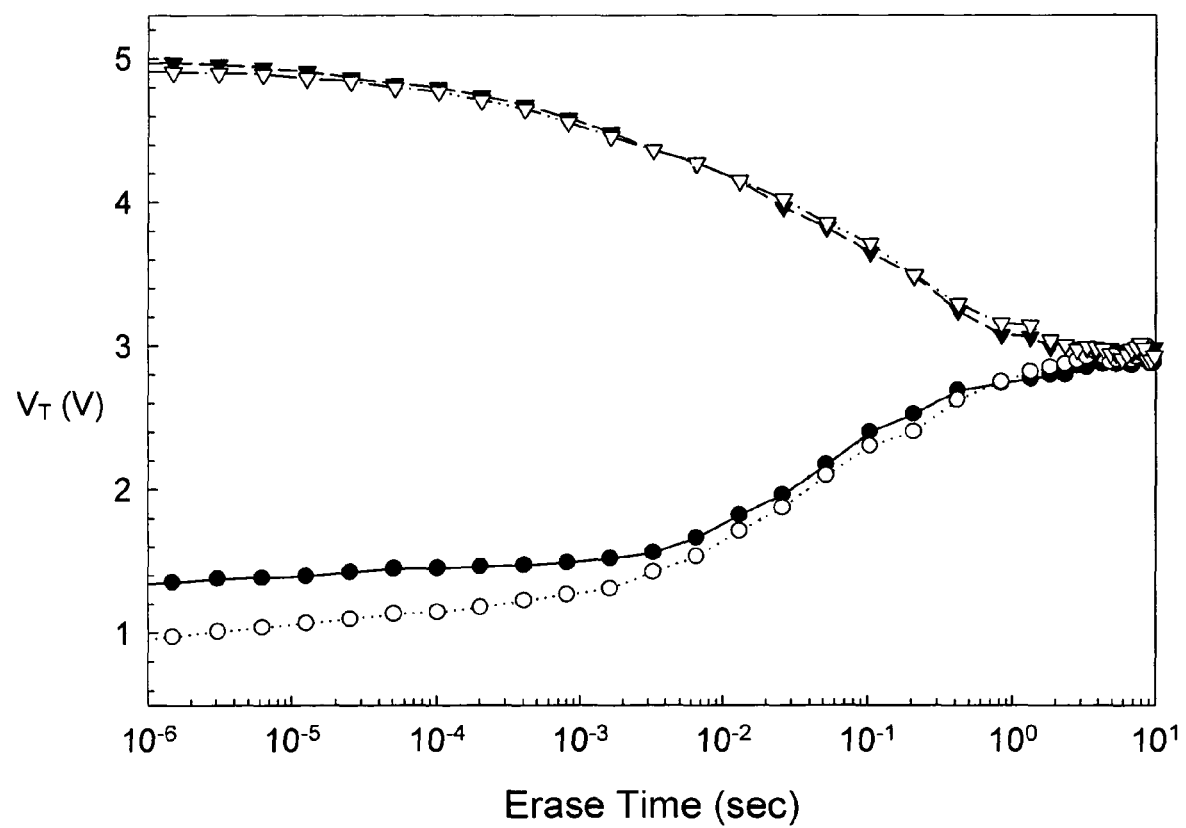
FIG. 13 is a graph showing the erase procedure that permits switching between programming a particular memory cell via different carrier movement processes.

FIG. 13 is a graph showing the erase procedure similar to the erase procedure of FIG. 8. However, unlike the erase procedure of FIG. 8, the erase procedure of FIG. 13 is performed on memory cells that are programmed, either by holes or by electrons. Both the threshold voltages of cells programmed by holes and the threshold voltages of cells programmed by electrons converge to about 3 V after about one to ten seconds.

Figure 15:
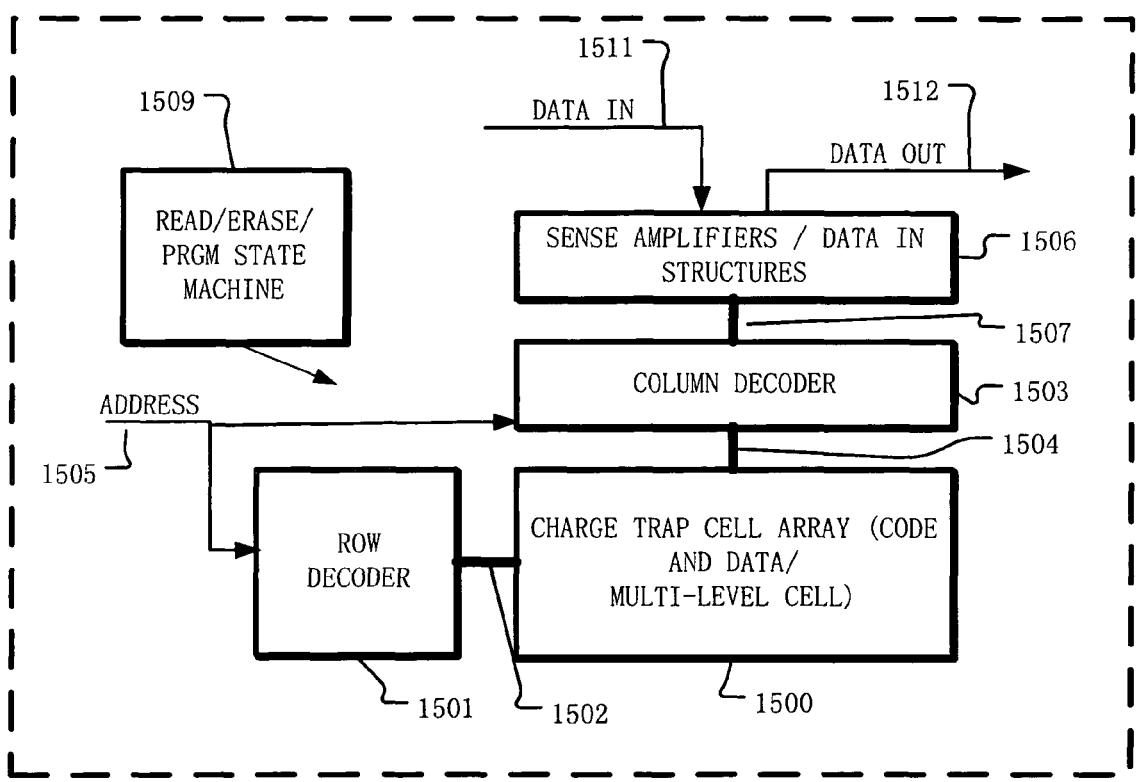
FIG. 15 is a more detailed diagram of an integrated circuit, including a memory array that programs data via different carrier movement processes.

FIG. 15 is a simplified block diagram of an integrated circuit supporting different carrier movement processes for programming, such as for code and data flash, or multi-level cell applications. The integrated circuit includes a memory array 1500 implemented using localized charge trapping memory cells configured for code storage. A row decoder 1501 is coupled to a plurality of word lines 1502 arranged along rows in the memory array 1500. A column decoder 1503 is coupled to a plurality of bit lines 1504 arranged along columns in the memory array 1500. Addresses are supplied on bus 1505 to column decoder 1503 and row decoder 1501. Sense amplifiers and data-in structures in block 1506 are coupled to the column decoder 1503 via data bus 1507. Data is supplied via the data-in line 1511 from input/output ports on the integrated circuit, or from other data sources internal or external to the integrated circuit, to the data-in structures in block 1506. Data is supplied via the data-out line 1512 from the sense amplifiers in block 1506 to input/output ports on the integrated circuit, or to other data destinations internal or external to the integrated circuit.

Resources for controlling the reading, programming and erasing of memory cells in the array 1500 are included on the chip. These resources include read/erase/program supply voltage sources (including for example charge pump circuits, voltage regulators, voltage dividers and the like) represented by block 1509 coupled to the other circuitry on the integrated circuit, which participate in operation of the device. Supply voltage sources are implemented in various embodiments using charge pumps, voltage regulators, voltage dividers and the like as known in the art, for supplying various voltage levels, including negative voltages, used in the read, erase and program operations.

The state machine 1509 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

Figure 14A:
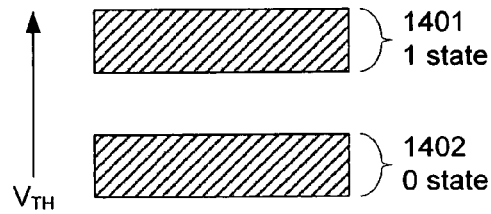
FIG. 14A is a threshold voltage state illustration with two states.
Figure 14B:
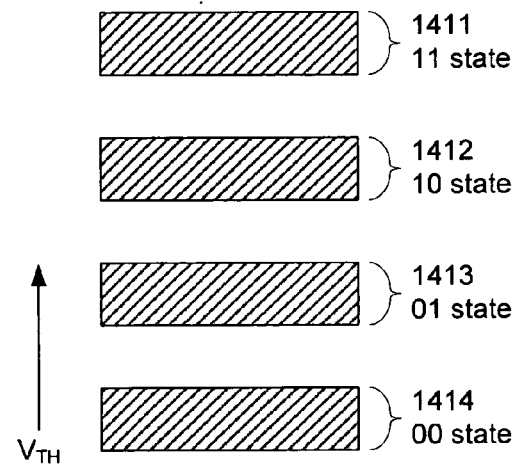
FIGS. 14B-14D are threshold voltage state illustrations with at least four states.
Figure 14C:
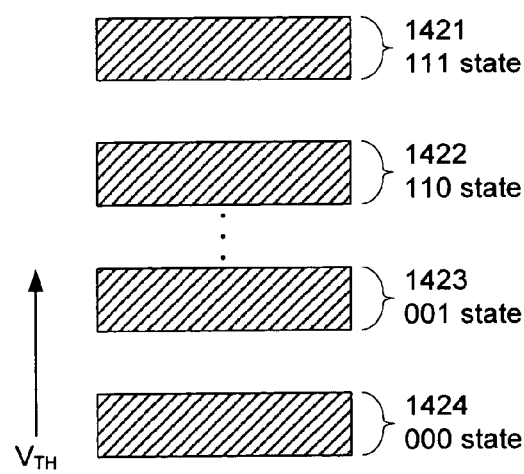
Figure 14D:
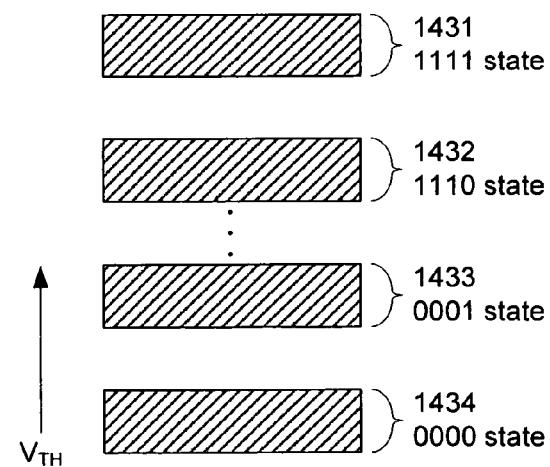

FIGS. 14A, 14B, 14C, and 14D are threshold state schematics corresponding to 1 bit, 2 bits, 3 bits, and 4 bits, respectively. FIG. 14A shows a schematic two-level threshold state operation. There are two states, the 1 state 1401 and the 0 state 1402. FIG. 14B shows a schematic for four-level threshold state operation. There are 4 states, the 11 state 1411, the 10 state 1412, the 01 state 1413, and the 00 state 1514. FIG. 14C shows a schematic for 8-level threshold state operation. There are 8 states, of which 4 states are shown, the 111 state 1421, the 110 state 1422, the 001 state 1423, and the 000 state 1524. FIG. 14D shows a schematic for 15-level threshold state operation. There are 15 states, of which 4 states are shown, the 1111 state 1431, the 1110 state 1432, the 0001 state 1433, and the 0000 state 1434. The threshold state schematics of FIGS. 14B, 14C, and 14D show possible implementations of multi-level cell applications, applied to each charge storage region of a charge storage structure. Different carrier movement processes can be applied for different parts of the threshold voltage region. For example, carrier movement processes that program via hole injection can program the threshold states with lower threshold voltages, carrier movement processes that program via electron injection can program the threshold states with higher threshold voltages, and a reset process can program a threshold states with an intermediate threshold voltage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
a semiconductor substrate;
a memory array on the substrate comprising charge storage, nonvolatile memory cells configured to store data in response to electrical signals applied to cause at least one of a first carrier movement process to program data in the memory array and a second carrier movement process to program data in the memory array; and
controller circuitry coupled to the memory array, including logic to apply electrical signals to cause the first carrier movement process to program data from a first threshold voltage to a second threshold voltage in the memory array and to apply electrical signals to cause the second carrier movement process to program data from the first threshold voltage to a third threshold voltage in the memory array, and to reset the nonvolatile memory cells in the array to the first threshold voltage,
wherein the first carrier movement process and the second carrier movement process are different types of carrier movement processes, and
wherein the second threshold voltage is different from the third threshold voltage.

2. The integrated circuit device of claim 1, wherein for a first pattern of data usage the logic applies the electrical signals to cause the first carrier movement process, and for a second pattern of data usage the logic applies the electrical signals to cause the second carrier movement process.

3. The integrated circuit device of claim 1, wherein the memory array has a range of threshold voltages, and the logic applies the electrical signals to cause the first carrier movement process over a first part of the range of threshold voltages and the logic applies the electrical signals to cause the second carrier movement process over a second part of the range of threshold voltages.

4. The integrated circuit device of claim 1, wherein, to switch between causing the first carrier movement process and the second carrier movement process in particular nonvolatile memory cells of the memory array of the memory array, the logic of the controller circuitry applies electrical signals to cause a reset process to the particular nonvolatile memory cells.

5. The integrated circuit device of claim 1, wherein the non-volatile memory cells in the memory array respectively comprise a first channel terminal, a channel, and a second channel terminal in the substrate, a first dielectric layer, a charge trapping structure and a second dielectric layer overlying the channel, and a gate terminal.

6. The integrated circuit device of claim 1, wherein the non-volatile memory cells in the memory array respectively comprise a first channel terminal, a channel, and a second channel terminal in the substrate, a first dielectric layer, a charge trapping structure and a second dielectric layer overlying the channel, and a gate terminal, and wherein the charge trapping structure comprises at least one of silicon nitride, $Al_2O_3$, $HfO_x$, $ZrO_x$, or other metal oxide.

7. The integrated circuit device of claim 1, wherein the non-volatile memory cells in the memory array storing data in response to electrical signals applied to cause the first carrier movement process, and the non-volatile memory cells in the memory array storing data in response to electrical signals applied to cause the second carrier movement process have a same cell structure.

8. The integrated circuit device of claim 1, wherein the first carrier movement process includes programming by hole injection.

9. The integrated circuit device of claim 1, wherein the first carrier movement process includes programming by band-to-band tunneling induced hole injection.

10. The integrated circuit device of claim 1, wherein the second carrier movement process includes programming by electron injection.

11. The integrated circuit device of claim 1, wherein the second carrier movement process includes programming by channel hot electron (CHE) injection.

12. The integrated circuit device of claim 1, wherein the second carrier movement process includes programming by channel initiated secondary electron injection (CHISEL).

13. The integrated circuit device of claim 1, wherein the first carrier movement process includes programming by hole injection, and the second carrier movement process includes programming by electron injection.

14. The integrated circuit device of claim 1, wherein the first carrier movement process includes programming by band-to-band tunneling induced hot hole (BTBTHH) injection, and the second carrier movement process includes programming by channel initiated secondary electron (CHISEL) injection.

15. The integrated circuit device of claim 1, wherein the controller circuitry is on the semiconductor substrate.

16. The integrated circuit device of claim 1, including an SRAM array and a user programmable processor on the semiconductor substrate coupled with the memory array.

17. The integrated circuit device of claim 1, wherein the first carrier movement raises a threshold voltage of at least one of the memory cells via channel hot electron injection.

18. The integrated circuit device of claim 1, wherein the first carrier movement raises a threshold voltage of at least one of the memory cells via channel initiated substrate hot electron injection.

19. The integrated circuit device of claim 1, wherein the second carrier movement lowers a threshold voltage of at least one of the memory cells via band to band hot hole injection.

20. The integrated circuit device of claim 1, wherein a threshold voltage of at least one of the memory cells is reset via a channel erase operation.

21. The integrated circuit device of claim 1, wherein the first carrier movement raises a threshold voltage of at least one of the memory cells via channel hot electron injection or channel initiated substrate hot electron injection, and the second carrier movement lowers the threshold voltage of said at least one of the memory cells via band to band hot hole injection, and the threshold voltage of said at least one of the memory cells is reset via a channel erase operation.

22. A method for program data in a memory array of an integrated circuit device with multiple carrier movement processes, comprising:
    applying electrical signals to program the memory array of charge storage, nonvolatile memory cells to cause a first carrier movement process to change selected cells of the memory array from a first threshold voltage to a second threshold voltage in the memory array, wherein the first carrier movement process and the second carrier movement process are different types of carrier movement processes; and
    applying electrical signals to program the memory array of charge storage, nonvolatile memory cells to cause a second carrier movement process to change selected cells of the memory array from the first threshold voltage to a third threshold voltage in the memory array,
    wherein the second threshold voltage is different from the third threshold voltage; and
    applying electrical signals to reset the nonvolatile memory cells in the array to the first threshold voltage.

23. A method for manufacturing an integrated circuit device, comprising:
    providing a semiconductor substrate;
    forming a memory array on the substrate comprising charge storage, nonvolatile memory cells configured to store data in response to electrical signals applied to cause at least one of a first carrier movement process to program data in the memory array and a second carrier movement process to program data in the memory array, wherein the first carrier movement process and the second carrier movement process are different types of carrier movement processes; and
    providing controller circuitry coupled to the memory array, including logic to apply electrical signals to cause the first carrier movement process to change selected cells of the memory array from a first threshold voltage to a second threshold voltage in the memory array and to apply electrical signals to cause the second carrier movement process to change selected cells of the memory array from the first threshold voltage to a third threshold voltage in the memory array, and to reset the nonvolatile memory cells in the array to the first threshold voltage, wherein the second threshold voltage is different from the third threshold voltage.

24. The integrated circuit device of claim 1, wherein the logic applies electrical signals to the memory array to implement multi-level operation having at least four threshold voltages.

25. The method of claim 22, further comprising:
    applying electrical signals to the memory array to implement multi-level operation having at least four threshold voltages.

26. The method of claim 23, wherein the logic applies electrical signals to the memory array to implement multi-level operation having at least four threshold voltages.

* * * * *